United States Patent
Ahn et al.

(10) Patent No.: US 6,277,728 B1
(45) Date of Patent: *Aug. 21, 2001

(54) MULTILEVEL INTERCONNECT STRUCTURE WITH LOW-K DIELECTRIC AND METHOD OF FABRICATING THE STRUCTURE

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/375,561

(22) Filed: Aug. 17, 1999

Related U.S. Application Data

(63) Continuation-in-part of application No. 08/874,389, filed on Jun. 13, 1997.

(51) Int. Cl.$^7$ .............................................. H01L 21/4763
(52) U.S. Cl. ..................... 438/619; 438/421; 438/422; 438/319
(58) Field of Search ................................... 438/619, 421, 438/422, 319

(56) References Cited

U.S. PATENT DOCUMENTS

| | | | |
|---|---|---|---|
| 5,461,003 | * 10/1995 | Havemann et al. | 437/187 |
| 6,060,383 | * 5/2000 | Nogami et al. | 438/622 |
| 6,078,088 | * 6/2000 | Buynoski | 257/410 |

OTHER PUBLICATIONS

Togo et al.; "A Gate–side Air–gap Structure (GAS) to Reduce the Parasitic Capacitance in MOSFETs"; 1996 Symposium on VLSI Technology Digest of Technical Papers; pp. 38 and 39.
Anand et al.; "NURA: A Feasible, Gas–Dielectric Interconnect Process"; 1996 Symposium on VLSI Technology Digest of Technical Papers; pp. 82 and 83.
Bohr; "Interconnect Scaling—The Real Limiter to High Performance ULSI"; IEDM 95, pp. 241–244.
Maliniak; "DAC attacks designer issues"; Electronic Design, vol. 43, No. 12, ISSN: 0013–4872, Jun. 12, 1995; 17 pages.
Hong et al.; "The effect of sol viscosity on the sol–gel derived low density $SiO_2$ xerogel film for intermetal dielectric application"; Thin Solid Films 332 (1998); pp. 449–454.

* cited by examiner

Primary Examiner—John F. Niebling
Assistant Examiner—David A Zarneke
(74) Attorney, Agent, or Firm—Dickstein Shapiro Morin & Oshinsky LLP

(57) ABSTRACT

A multilevel interconnect structure with a low-k dielectric constant is fabricated in an integrated circuit structure by the steps of depositing a layer of photoresist on a substrate assembly, etching the photoresist to form openings, forming a metal layer on the photoresist layer to fill the openings and then removing the photoresist layer by, for example, ashing. The metal layer is supported by the metal which filled the openings formed in the photoresist.

24 Claims, 6 Drawing Sheets

MULTILEVEL INTERCONNECT STRUCTURE WITH LOW-K DIELECTRIC AND METHOD OF FABRICATING THE STRUCTURE

CROSS-REFERENCE TO RELATED APPLICATION

This application is a continuation-in-part of U.S. application Ser. No. 08/874,389, filed on Jun. 13, 1997. U.S. application Ser. No. 08/874,389 is incorporated herein by reference.

BACKGROUND OF THE INVENTION

The present invention relates to a semiconductor multi-level interconnect structures exhibiting a low RC time delay and which take less time to fabricate. More particularly, the present invention relates to a semiconductor multilevel interconnect structure made of metals having a low resistivity and insulators having a low dielectric constant k, and to a method of fabricating the multilevel interconnect structure with a low-k dielectric.

It is common in the semiconductor art to use layers of metal, polysilicon, or another conductor to conduct current between various semiconductor structures with an integrated circuit, and to external terminals for the integrated circuit, by means of conductive vias.

When a metal is used to form the interconnect layers of conductors, the metal is usually deposited on the semiconductor by sputtering, chemical vapor deposition (CVD), or evaporation. The CVD process forms a non-volatile solid film on a substrate by the reaction of vapor phase chemicals that contain the desired constituents. The metals that are commonly used for the interconnect layers are aluminum and its alloys, although other conductive metals and materials can also be used, with copper being a recent preference. The metal layers are typically deposited over dielectric materials, such as silicon dioxide. Parallel plate capacitive effects can be observed with a conductive interconnect structure. The capacitance for adjacent conductive layers can be represented as:

$$C = \frac{\varepsilon_o \varepsilon_{ins} A}{D}$$

where

D+$SiO_2$ thickness
A=Area of plates (adjacent conductors)
$\epsilon_o$=Permittivity of free space
$\epsilon_{ins}$=Relative Permittivity of $SiO_2$ This capacitance at a metal interconnected plate increases as the density of the integrated circuits increases. Also, the line resistance due to the metal layers increases as the density of the integrated circuits increases. The resistance of a sheet of conducting material is given as:

$$R_s = \frac{rL}{tW}$$

where r=Material resistivity
L=Material length
t=Material thickness
W=Material width Thus, the time delay caused by the product of the line resistance and the capacitance (RC delay) becomes increasingly critical as device size decreases and which circuit speed increases.

An attempt to reduce the capacitance association with interconnect layers deposited on dielectric materials is shown in Togo et al., "A Gate-side Air-gap Structure (GAS) to Reduce the Parasitic Capacitance in MOSFETs", 1996 Symposium on VLSI Technology, Digest of Technical Papers, pp. 38–39. Togo et al outlines a transistor structure in which the sidewalls of the gate structure are surrounded by an air gap. A silicon nitride sidewall is first fabricated that surrounds the gate. A layer of silicon dioxide is formed around the silicon nitride sidewall. The silicon nitride sidewall is removed by a wet etching process to form an air gap between the gate structure and the silicon dioxide.

Another attempt to reduce the capacitance associated with interconnect layers deposited on silicon is shown in Anand et al, "NURA: A Feasible, Gas-Dielectric Interconnect Process", 1996 Symposium on VLSI Technology, Digest of Technical Papers, pp. 83–83. Anand et al outlines a metal interconnect structure in which layers of a gas are formed between thin layers of silicon dioxide. The thin layers of silicon dioxide have metal interconnect layers deposited on them. The process begins when layers of carbon are formed on a surface and trenches are formed for future interconnections. An interconnect metal layer is formed in the carbon trenches and a thin layer of silicon dioxide is sputter-deposited. Oxygen is then furnace ashed into the carbon layer through diffusion and the oxygen reacts with the carbon to form carbon dioxide. This process is repeated to form the interconnect structure of the device under fabrication.

Although Togo et al claims to reduce the capacitance associated with the interconnect layers by reducing the dielectric constant of the materials between the interconnect layers, Togo et al only provides a low dielectric material (air) around the gate contact of a transistor. Also, Togo et al does not disclose an interconnect structure that has reduced resistivity.

Likewise, even though Anand et al claims to reduce the capacitance associated with the interconnect layers by reducing the dielectric constant of the materials between the interconnect layers, Anand et al adds complexity to the semiconductor fabrication process because carbon is used in the process, which is not typically used in the manufacture of semiconductor devices. The method of Anand et al does not disclose an interconnect structure that has reduced resistivity.

Thus, the need exists for a semiconductor interconnect structure with reduced capacitance and reduced resistivity, thereby decreasing the RC time delay associated with the interconnect layers. The need also exists for a method of fabricating such a structure using standard fabrication steps in conjunction with commercially available processing equipment.

Also, steady improvements in integrated circuit density and performance have been achieved over the past two decades by transistor scaling. While the scaling continues to be necessary, metal interconnects are now becoming a significant limiting factor and are as important as transistors in determining ULSI density and performance. As discussed by M. T. Bohr in "Interconnect Scaling-The Real Limiter to High Performance ULSI", 1995 IEDM Technical Digest, p. 241–244, each technology generation represents a 0.7x reduction in feature size, and interconnect delay degrades at a rate of 2x per generation assuming a constant metal aspect ratio and no change in conductor or dielectric materials.

As the feature size goes down so does insulator thickness so the interconnect capacitance remains the same while the wiring resistance doubles. Interconnect delay for large high-frequency chips is already a significant portion of the clock cycle time and will soon exceed the cycle time requirements if traditional interconnect scaling is continued.

Also the increasing density/complexity of circuits and speed of operation result in excessive power dissipation in digital switching and clocking circuits. The power dissipation is approximately represented by:

Power~$CV^2f$ where C=the capacitance of the clock line,
V=the voltage swing, and
f=the clock frequency.

As noted by L. Maliniak, "DAC attacks designer issues", Electronic Design, vol. 43, p. 66, Jun. 12, 1995, clock distribution can account for up to 40% of the total power dissipation in high-performance wireless computing and communication systems.

Similar considerations apply in calculating the power dissipation of digital switching circuits.

SUMMARY OF THE INVENTION

As attempts to provide higher speed small sized devices continues it is becoming increasingly difficult to achieve desired objectives because of RC effects and the complexity and time of device fabrication required to reduce such effects.

In accordance with the present invention, the deposition time of dielectric films in a multilevel interconnect structure is minimized by reducing the number of dielectric deposition cycles. In a preferred embodiment the number of dielectric deposition cycles is reduced to one. Instead of depositing an interlayer dielectric layer after each metal layer, the multilevel interconnect structure is built using sacrificial photoresist layers, followed by a single dielectric layer deposition cycle.

Thus, the present invention is directed to a multilevel interconnect semiconductor structure having a low-k dielectric outer coating and to a method of fabricating the structure. The interconnect structure is fabricated using typical fabrication steps, materials, and machines.

The method, in its broadest form, comprises the steps of depositing a layer of photoresist on a substrate assembly, etching the photoresist to form openings, depositing a metal layer on the photoresist layer so as to fill the openings, and removing the photoresist layer by, for example, ashing in an oxygen plasma. An upper level conductive metal layer is supported by the metal which filled the openings formed in the photoresist to form a multilevel metallized interconnect structure. The upper level of the interconnect structure is then coated with a low-k dielectric film.

The conductive layers preferably comprise copper, and the single dielectric deposition is preferably in the form of a layer of an aerogel or xerogel.

The present invention represents significant advantages over the prior art. Because the air (gas) spaces between the conductive interconnect layers are formed by removing layers of photoresist, no extra material need be introduced into the semiconductor manufacturing process. Also, because the conductive interconnect layers are surrounded by air, the plate capacitance of the interconnect structure is reduced. Furthermore, because a low resistive material such as copper is used for the conductive interconnect layers, the layers may be electroplated or electroless plated at low temperatures.

Reducing the dielectric constant of the inter-level dielectric improves interconnect signal delay and reduces AC power consumption. Also, the total process time just for the deposition of dielectrics at multiple levels can exceed 200 hours. Therefore, reducing the time for the deposition of dielectric layers is a significant advantage.

The above and other features and advantages of the invention will be more readily understood from the following detailed description of the invention which is provided in conjunction with the accompanying drawings.

DETAILED DESCRIPTION OF THE INVENTION

Figure 1:
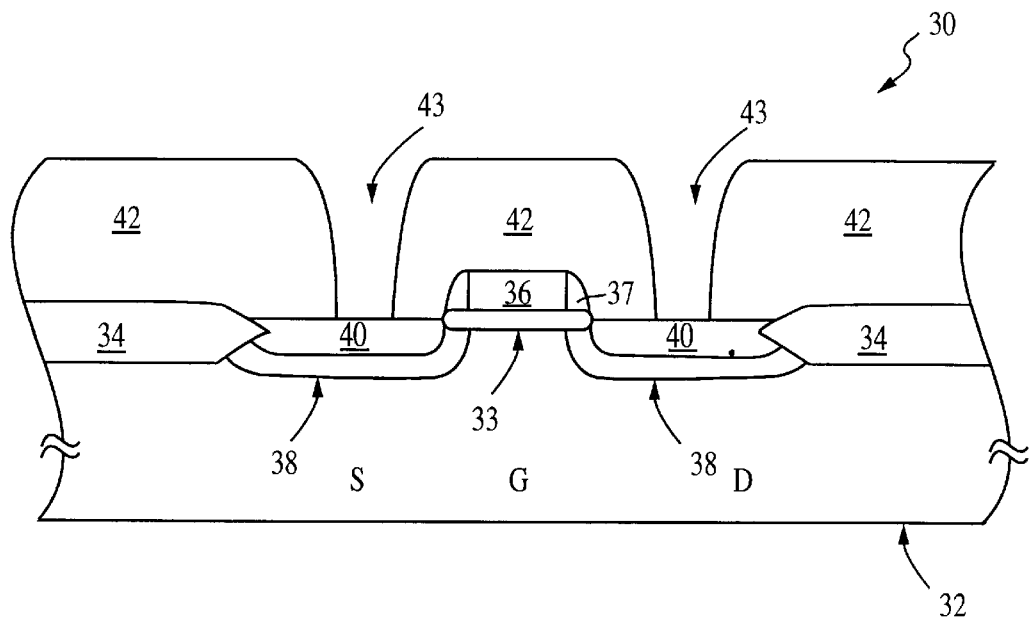
FIG. 1 is a cross-sectional view of a substrate assembly on which a layer of photoresist has been deposited, masked, hardened, and etched.

The discussion below refers to a bilayer adhesion promoter/diffusion barrier. As used herein, a bilayer adhesion promoter/diffusion barrier means that the bilayer functions to enhance adhesion of the metal layer to the structure and to minimize the diffusion of metal from the metal layer into dielectric material.

The present invention relates to the provision of an interconnect structure which has an improved RC response for high speed signal transmission and which is relatively easy to construct: By way of background, methods of depositing aerogels, xerogels and other spin-coated dielectric materials used as interconnect dielectronics often require complicated, extensive processing. For example, the low-density $SiO_2$ xerogel films which are often used to insulate an interconnect structure are prepared by a sol-gel process which offers the precise control of microstructure (pore size, pore volume, and surface area). A typical process involves a spin coating (20 sec), aging/washing (24 hours), surface modification (12 hours), and drying/thermal treatment (2 hours). See J-K Hong et al, "The effect of sol viscosity on the sol-gel derived low-density $SiO_2$ xerogel film for intermetal dielectric application", Thin Solid Films, vol.332, p.449–454, 1998, which is incorporated herein by reference. For future microprocessors requiring 6 to 7 levels of metallization, the total process time could easily exceed 200 hours just for the deposition of dielectrics.

In accordance with the present invention, the deposition time of dielectric films is minimized by reducing the number of dielectric deposition cycles. In a preferred embodiment the number of dielectric deposition cycles is reduced to one. Instead of depositing interlayer dielectric after each metal layer, the multilayer metallization is built using sacrificial photoresist layers, followed by a single dielectric deposition cycle. In addition to reducing manufacturing time, the resultant interconnect structure has good high speed signal transmission properties because of lowered RC effects.

Low-k dielectric materials, including fluorine-doped $SiO_2$, polymers and aerogels which could be used as an interconnect insulator are shown in the following Table. As shown, low-k dielectrics have a dielectric constant less than [or equal to] 4.5.

TABLE*

| MATERIAL METHOD | DIELECTRIC CONSTANT | DEPOSITION |
|---|---|---|
| Undoped plasma SiO2** CVD, . . . | 3.9–4.5 | |
| Fluorine doped SiO2 | ~3.5 | CVD |
| Flowable Oxide | ~3.5 | Spin-on |
| Spin-on glass | 2.8–3.0 | Spin-on |
| Porous SiO2 | <2.0 | Spin-on |
| Polyimide | 3.0–3.7 | Spin-on |
| Polyimide siloxane | 2.6–2.7 | Spin-on |
| Polysilsesquioxane (Si polymer) | 2.7–3.0 | Spin-on |
| Benzocyclobutene (BCB) | 2.5–2.7 | Spin-on |
| Parylene N | 2.6–2.7 | CVD |
| Fluorinated Polyimide | ~2.5 | Spin-on |
| Poly(Olefins) | 2.4–2.6 | Spin-on |
| Parylene F | 2.3–2.4 | CVD |
| Poly-Naphthalene | ~2.3 | CVD |
| Amorphous teflon | 1.9–2.1 | Spin-on |
| Polymer foams | <2–3.0 | Spin-on |
| Aerogels | 1.1–2.0 | Spin-on |
| Air | 1.0 | |

*H. Rathore and D. Nguyen, "Advanced Metallization and Low-k Dielectrics for ULSI Interconnect", 1998 VLSI Technology Short Course, June 8, 1998, Honolulu, Hawaii, which document is incorporated herein by reference.
**(e.g., PECVD SiO2 SiH4-based or TEOS based, HDP, BPSG, PPSG, . . .)

Of the low-k dielectrics reported in the Table, aerogels possess the lowest dielectric constant. Aerogels and also xerogels have a dielectric constant of between 1.1 and 2.0, and also the highest thermal stability (900° C.). Therefore, aerogels and xerogels are preferred for use in accordance with the present invention in ULSI technology. It should also be noted that air has the lowest dielectric constant of 1.0.

A suitable dielectric material for use in the present invention has a dielectric constant of from about 1 to about 2.5.

A preferred dielectric constant range is from about 1 to about 2.0. Other properties of suitable low k-material are no or low moisture absorption, thermal stability, and mechanical stability to be compatible with chem-mechanical planarization process. The material should be compatible with low & high temperature chip pull off, such that it contains no residues that may outgas during later process at high temperature or at pull off. The material also preferably has a glass transition (Tg) temperature of >350° C., a high breakdown field strength of >5MV/cm, and a low leakage current of <1nA @ use voltage. Following is an embodiment of the method of fabricating a multilevel interconnect structure with a low-k dielectric material in accordance with the present invention.

With reference to FIG. 1, there is shown a cross-sectional view of a typical substrate assembly 30. The assembly 30 includes a substrate layer 32, which is the lowest layer of semiconductor material on a wafer and additional layers or structures formed thereon. A Local Oxidation of Silicon (LOCOS) process is performed on the substrate layer 32 to provide a layer of gate oxide 33 and device separating field oxide regions 34 formed of, for example, $SiO_2$. A polysilicon layer 36 is deposited and etched to provide a contact area, typically for the gate terminal G of a transistor. An isolation insulating spacer 37 may be formed along the sides of layer 36 using conventional techniques. Impurities are diffused into the substrate 34 through suitable masks to form diffusion areas 38. The diffusion areas 38 provide the source S and drain D terminals of the transistor. Silicide layers 40 are formed on the diffusion areas 38. The silicide layers 40 are formed by depositing a refractory metal such as titanium, platinum, palladium, cobalt, or tungsten on polysilicon. The metal/silicon alloy is then sintered to form the silicide layers 40.

After the silicide layers 40 are formed, the substrate assembly 30 is then ready for metallization. A first layer of photoresist 42 is deposited on the substrate assembly 30 and is masked, hardened, and etched to define openings 43 for contact plugs. The photoresist layer 42 is hardened by baking the substrate assembly 30 at a temperature typically below 100° C.

Figure 2:
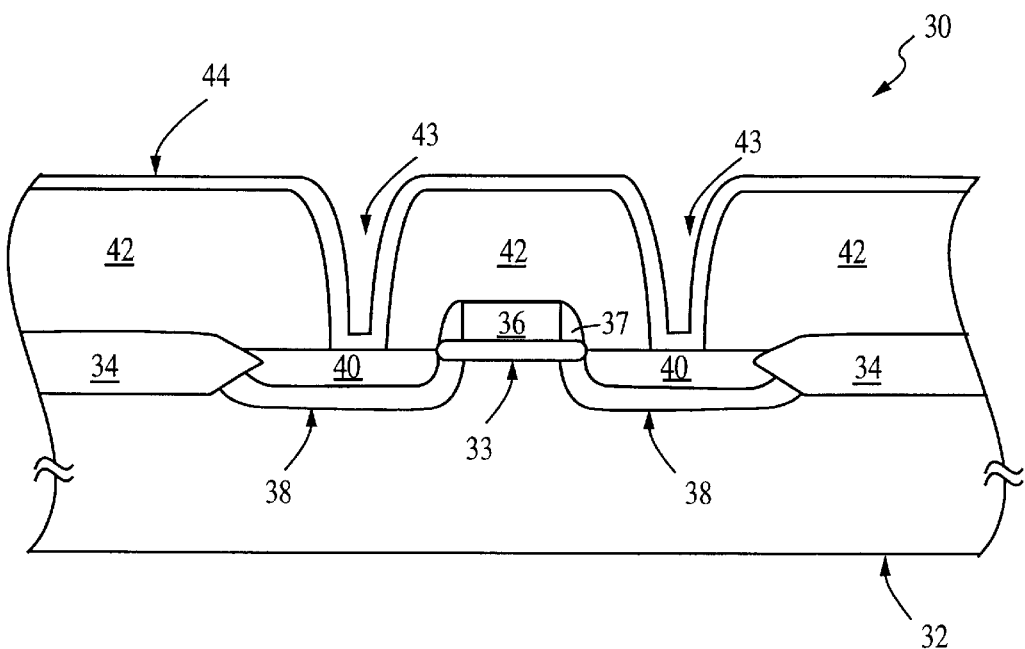
FIG. 2 is a cross-sectional view of the substrate assembly of FIG. 1 on which a bilayer adhesion promoter/diffusion barrier has been deposited on the etched photoresist layer.

Since copper tends to diffuse into a dielectric material, it is preferred to counter such diffusion with a diffusion barrier. FIG. 2 shows the substrate assembly 30 of FIG. 1 after a bilayer adhesion promoter/diffusion barrier 44 is deposited by, for example, sputtering onto the surface of the etched photoresist layer 42. Ionized sputtering is preferred to provide effective coverage of the sidewalls of deep openings. A chemical vapor deposition (CVD) process may also be used to deposit the bilayer adhesion promoter/diffusion barrier 44.

The bilayer adhesion promoter/diffusion barrier 44 can be, among other substances, titanium/copper, chromium/copper, titanium nitride/copper, tantalum/copper, W/copper or WN/copper. Typical thickness is 10 to 20 nm for the adhesive layer and 20 to 30 nm for the copper to be used as a plating base.

The bilayer can be deposited as two layers. Alternatively, the bilayer can be simultaneously deposited from two different sources, e,g., two targets would be used in an ionized sputtering process, or two gas sources could be used in a CVD process.

The deposition of adhesion promotor/diffusion barrier 44 may be eliminated if a CVD process is used as discussed below for deposition of conducting metal such as copper and aluminum alloys. This step may also be eliminated when deposition techniques such as high-rate magnetron sputtering or evaporation are employed to produce a conducting metal layer as described below.

Figure 3:
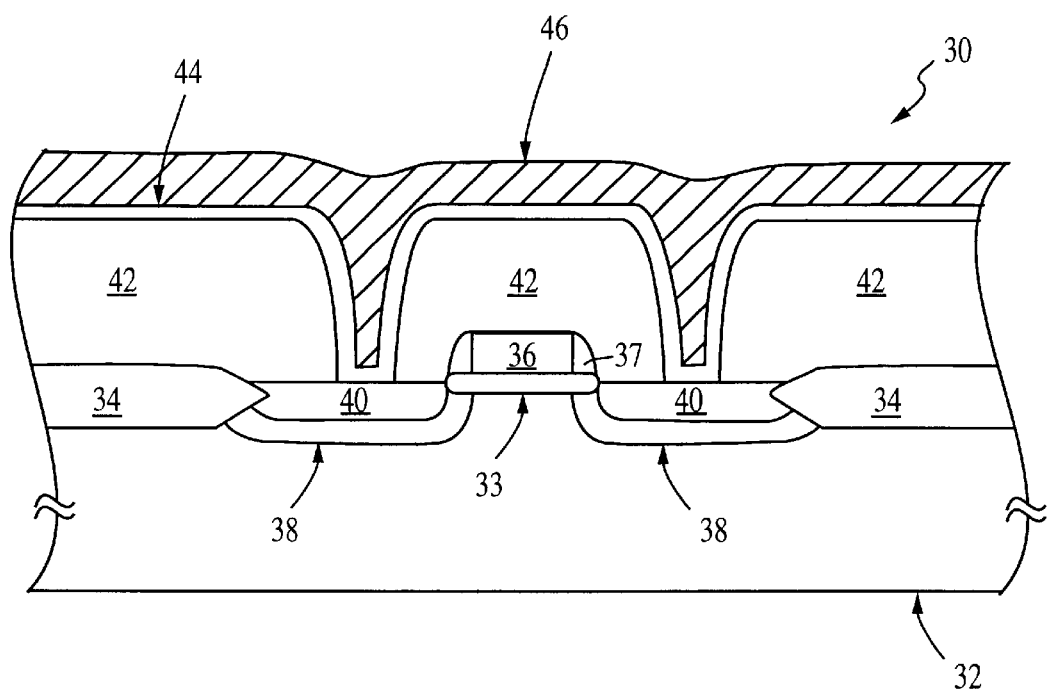
FIG. 3 is a cross-sectional view of the substrate assembly of FIG. 2 on which a metal layer has been deposited on the bilayer adhesion promoter/diffusion barrier.

As shown in FIG. 3, a metal layer 46 is formed, for example, by plating on the bilayer adhesion promoter/diffusion barrier 44. The metal layer 46 is preferably cooper, which can be electroplated or electroless plated on the substrate assembly 30 at a process temperature around 30° C. A thick copper film (0.5 to 1.0 micron thick) preferably is deposited. The metal layer 46 may also be deposited using a CVD process. As noted, if the metal layer 46 is deposited by a CVD process or by high-rate magnetron sputtering or by evaporation, the bilayer adhesion promotor/diffusion barrier 44 may optionally be eliminated.

Figure 4:
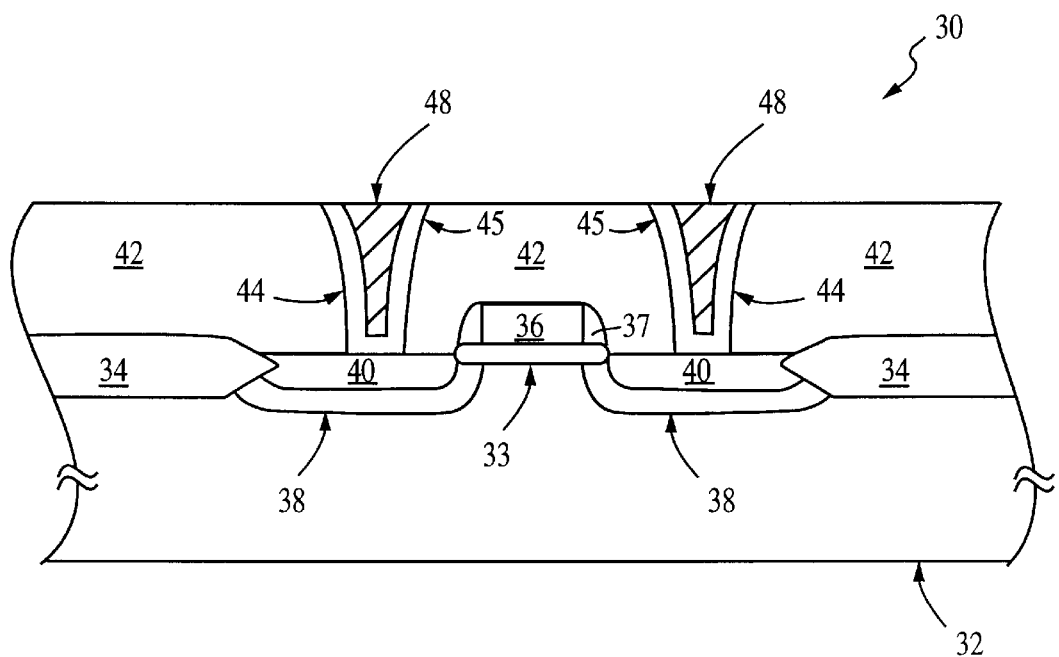
FIG. 4 is a cross-sectional view of the substrate assembly of FIG. 3 following removal of excess metal from the metal layer to form metal plugs.

The excess metal from the metal layer 46 and the excess bilayer adhesion promoter/diffusion barrier 44 are next removed through mechanical abrasion, for example, by chemical mechanical polishing (CMP), to form metal plugs 48, as shown in FIG. 4. The substrate assembly 30 is planar after the removal of the excess metal. The remaining portions of the bilayer adhesion promoter/barrier 44 define receptacles 45, in which the metal plugs 48 are located.

Figure 5:
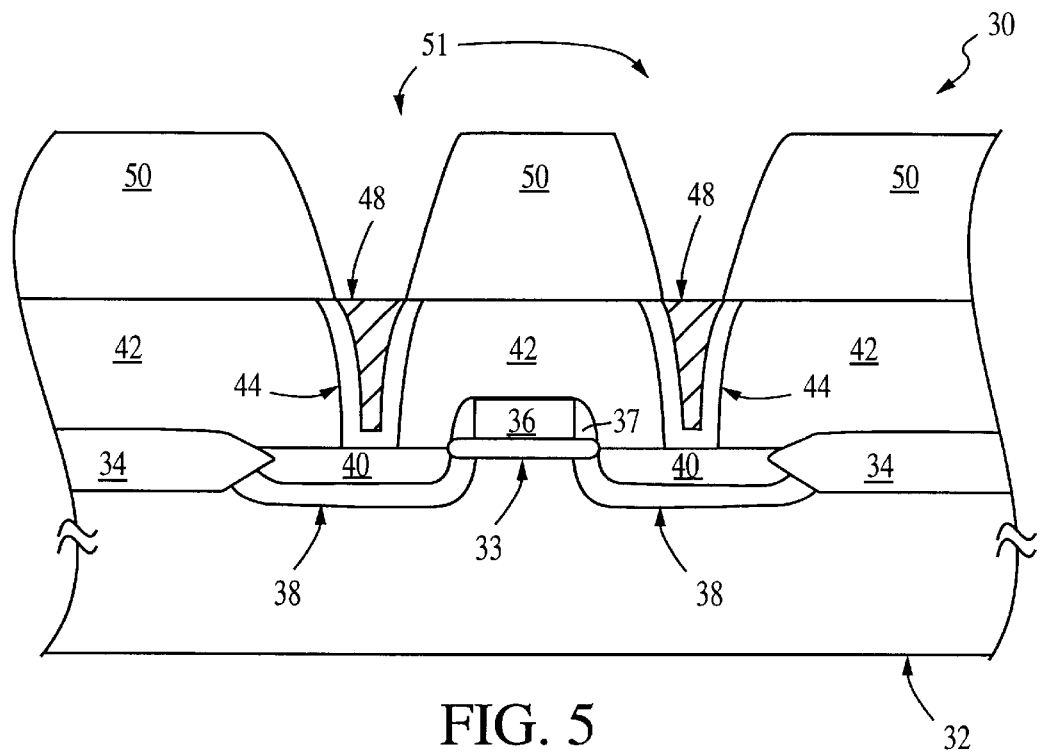
FIG. 5 is a cross-sectional view of the substrate assembly of FIG. 4 on which a photoresist layer has been deposited, masked, hardened, and etched on the promoter layer and metal plug.

A second photoresist layer 50 is next deposited onto the bilayer adhesion promoter/barrier 44 and the metal plugs 48 as shown in FIG. 5. The photoresist layer 50 is masked, hardened, and etched to define openings 51 for a metal layer which is aligned with the plugs 48.

Figure 6:
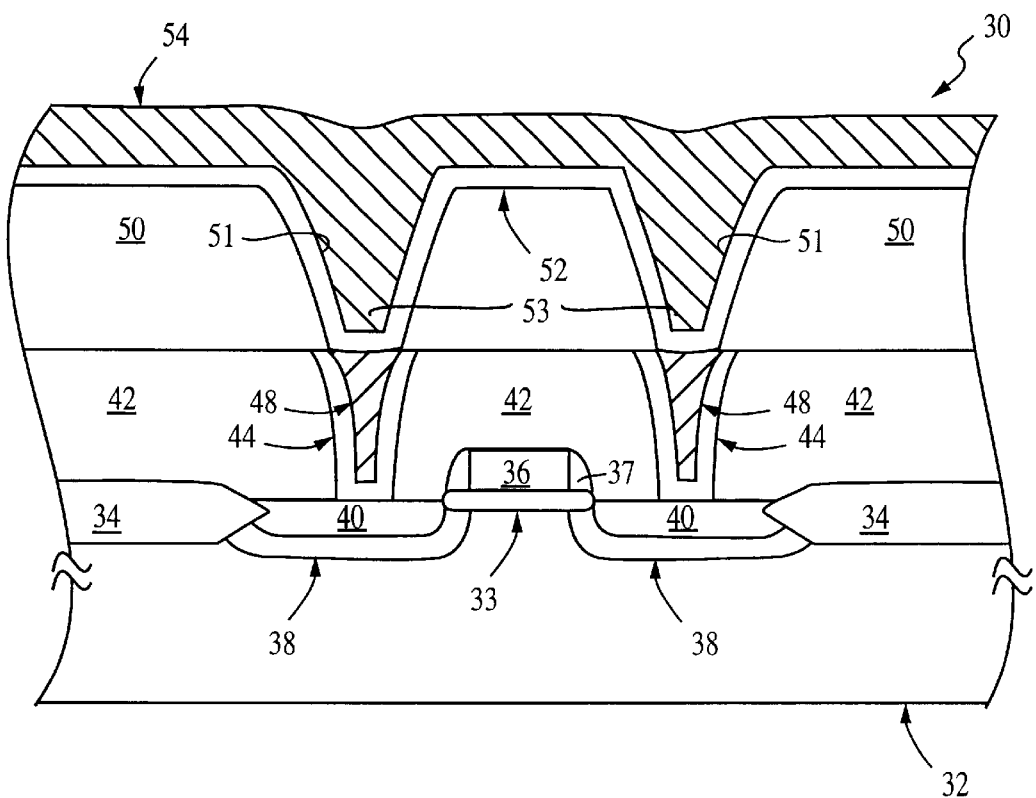
FIG. 6 is a cross-sectional view of the substrate assembly of FIG. 5 on which a bilayer adhesion promoter/diffusion barrier and a first metal layer have been deposited on the etched photoresist layer.

FIG. 6 shows a bilayer adhesion promoter/barrier 52 deposited on the etched photoresist layer 50 and metal plugs 48 and a second metal layer 54 plated on the bilayer adhesion promoter/barrier 52. A portion of the metal fills the openings 51 forming contacts 53. The second metal layer 54 is deposited, for example, by electroplating using a plating base. Alternately, a plating base is not needed when metal layer 54 is deposited by CVD, high-rate magnetron sputtering, or evaporation, as was noted above for metal layer 46.

Figure 7:
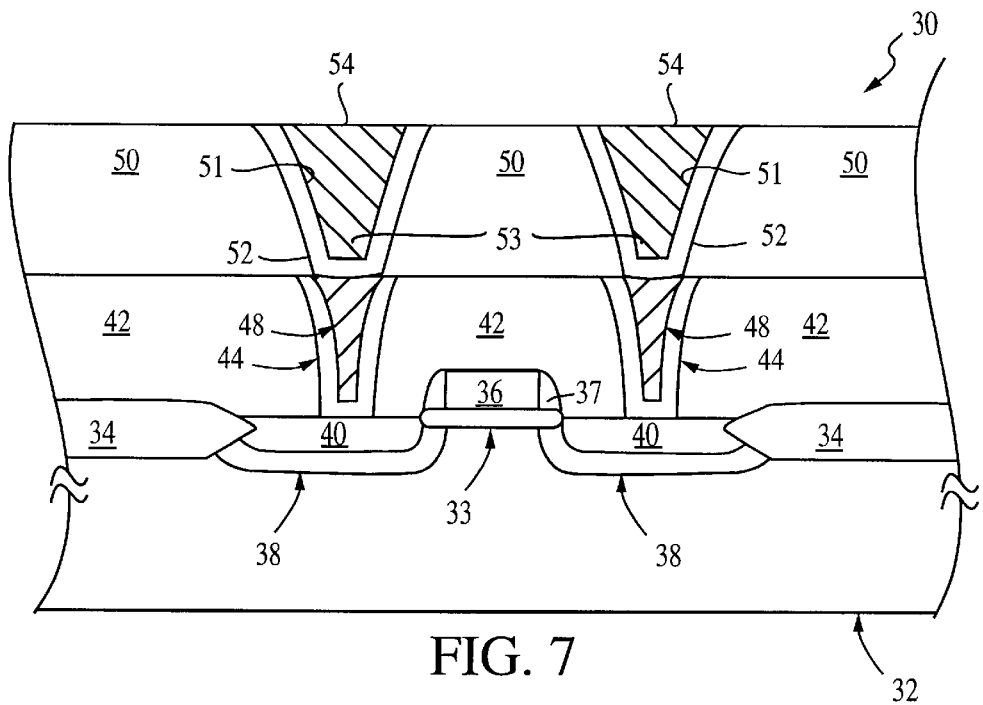
FIG. 7 is a cross-sectional view of the substrate assembly of FIG. 6 following the removal of excess metal from the first metal layer.

As shown in FIG. 7, excess metal from the second metal layer 54 and excess bilayer adhesion promoter/barrier 52 are next removed by mechanical abrasion, such as chemical mechanical polishing (CMP). Thus, the second metal layer 54 forms contacts 53 and the resulting substrate assembly is planar.

Figure 8:
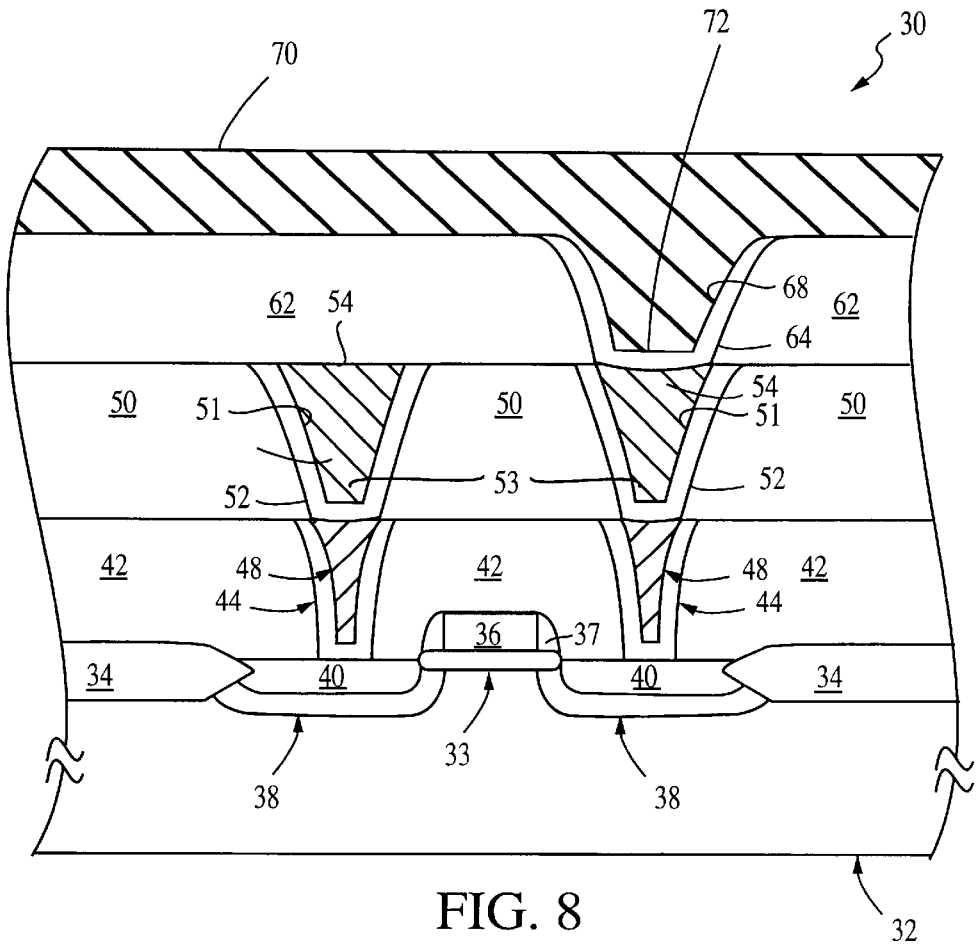
FIG. 8 is a cross sectional view of the substrate assembly of FIG. 7 following the addition of a photoresist layer, a bilayer adhesion promoter/diffusion barrier, a metal plug, and a second metal layer onto the etched photoresist layer and the first metal layer.

FIG. 8 illustrates the substrate assembly 30 of FIG. 7 after (i) photoresist layer 62 is deposited, hardened and etched, (ii) a bilayer adhesion promoter/diffusion barrier 64 is deposited and CMP planarized, and (iii) a third metal layer 70 is deposited onto the substrate assembly 30. The substrate assembly 30 in FIG. 8 has been mechanically polished to remove the excess metal layer 70 and the remaining portions of the bilayer adhesion promoter/diffusion barrier 64 to form metal plug 66 in receptacle 68. The third metal layer 70 forms contact 72. The surface 54 is in contact with another metal plug and receptacle or other assembly component which is not shown in the cross-sectional view of FIG. 8. The steps of applying a patterned photoresist layer, a bilayer adhesion promotor/diffusion barrier 52 (sometimes optional as noted above), and another metal layer, as described with reference to FIGS. 5 to 8, can be repeated to build up more metal layers, as needed.

Figure 9:
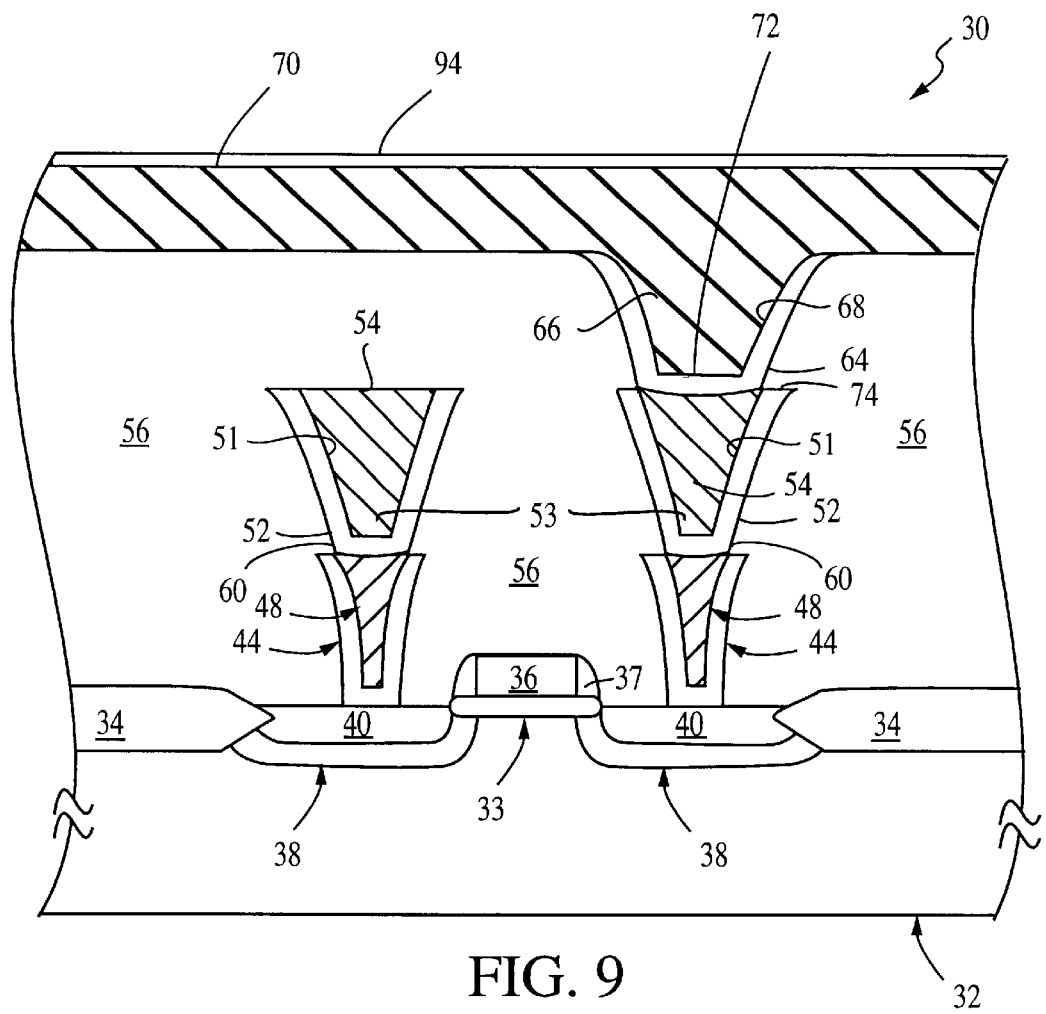
FIG. 9 is a cross-sectional view of the substrate assembly of FIG. 8 following the removal of the photoresist layers to form gaps between the bilayers of adhesion promoter/diffusion barrier and the underlying substrate assembly.

FIG. 9 shows a resulting substrate assembly 30 of FIG. 8 with the first metal layer 48, the second metal layer 54 and the third metal layer 70 formed. The photoresist layers 42, 50 and 62 are next removed by, for example, ashing in oxygen plasma to form air gaps 56. The metal layers 54 and 70 are supported by columns 60 and 74 formed by the combination of the metal plugs 48 and the contacts 53 and 72. The air gaps 56 have a dielectric constant of 1, thereby reducing the residual capacitance of the resulting interconnected structure. By selecting appropriate metal conductors which have a low resistance, such as copper, the overall RC time constant of the resulting interconnected structure is reduced.

At this stage, a suitable bilayer adhesion promoter/diffusion barrier may deposited over the entire structure in one step by, for example, sputtering. Ionized sputtering is preferred to provide effective coverage of the sidewalls of deep openings. Also, a chemical vapor deposition (CVD) process or electroless' plating may be used to deposit the bilayer adhesion promoter/diffusion barrier.

Figure 10:
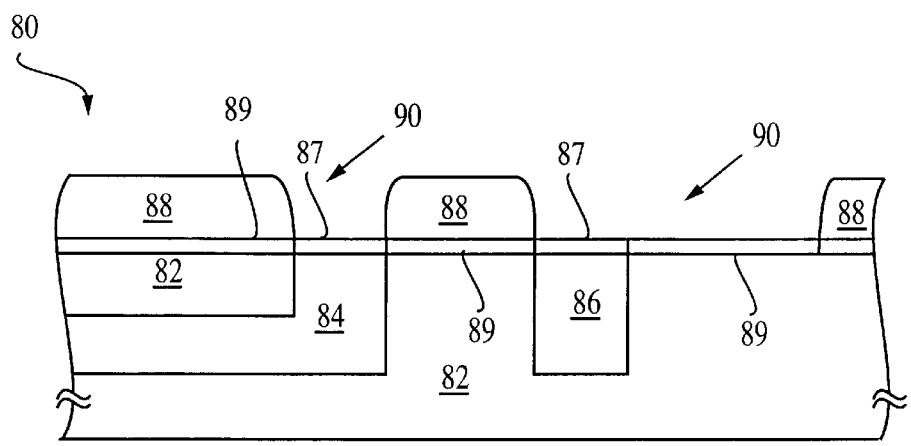
FIG. 10 is a cross-sectional view of another embodiment of a substrate assembly on which a layer of photoresist has been deposited, masked, hardened, and etched.
Figure 11:
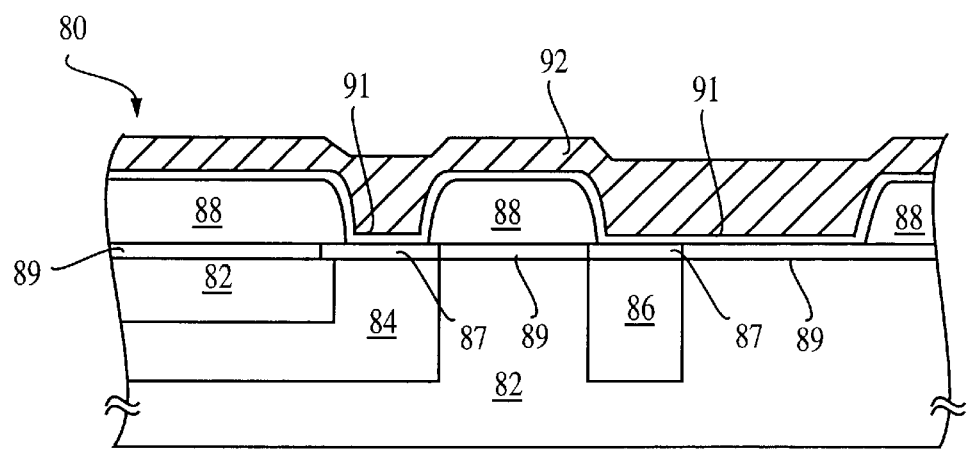
FIG. 11 is a cross-sectional view of the substrate assembly of FIG. 10 on which a bilayer adhesion promoter/diffusion barrier has been deposited on the layer of photoresist and on which a metal layer has been deposited on the bilayer.
Figure 12:
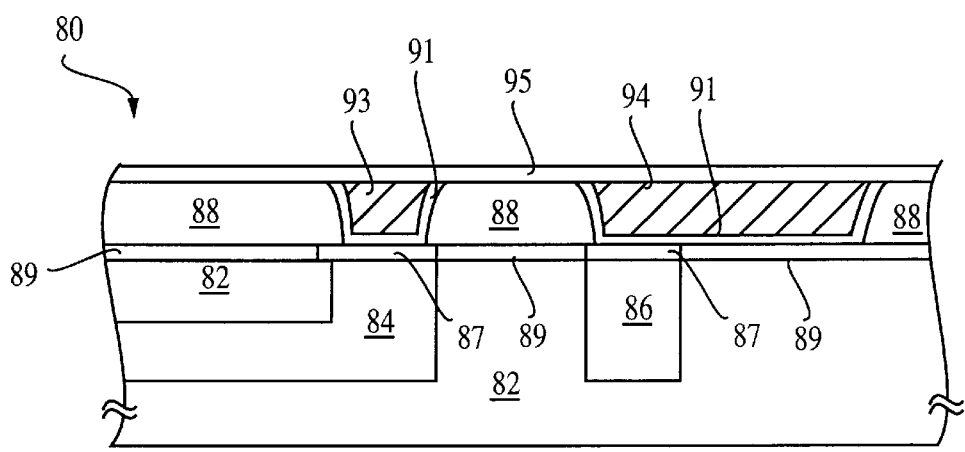
FIG. 12 is a cross-sectional view of the substrate assembly of FIG. 11 following removal of excess metal from the metal layer to form metal plugs and then coated with a low-k dielectric film.

The multilevel metallized interconnect structure of FIG. 9 is then coated with a low-k dielectric film 94 in one step. This one step may be a sol-gel method, a CVD, a spin-on process, or a vapor deposition process. If needed, the low-k dielectric film 94 is planarized. As noted, preferred materials for film 94 are those listed in the table above having a low dielectric constant, preferably between about 1 and about 2.5 and most preferably between about 1 and about 2, with aerogels and xerogels being particularly prefered. Another embodiment of the invention is shown in FIGS. 10 to 12. In this embodiment the invention is applied to creating upper levels of interconnects which may be used for long signal interconnections and clock distribution.

With reference to FIG. 10, there is shown a cross-sectional view of a typical substrate assembly 80 having upper levels of interconnected metal which are used for long signal interconnections and clock distribution. The assembly 80 includes a lower insulation layer 82 of $SiO_2$ which is applied to the upper surface of a fabricated circuit and which has metal contacts 84, 86 formed therein.

Metal contacts 84, 86 may, if desired, be formed using the techniques described above with reference to FIGS. 1–9 for underlying metal interconnect layers. Alternatively, conventional metal interconnect layers may reside below contacts 84, 86. Diffusion barrier layers 87, 89 are deposited on the surface of insulation layer 82 and the lower planar metal contacts 84, 86. For example, a layer 89 of $Si_{3N4}$ is applied over the lower oxide insulator 82 of $SiO_2$, and a layer 87 of TiN is applied over the lower metal contacts 84, 86.

A first layer of photoresist 88 is deposited on the substrate assembly 80 and is masked, hardened, and etched to define openings 90 for contact plugs.

FIG. 11 shows the substrate assembly 80 of FIG. 10 after a bilayer adhesion promoter/diffusion barrier 91 is deposited by, for example, sputtering onto the surface of the etched photoresist layer 88.

As shown in FIG. 11, a metal layer 92 is also formed, for example, by plating on the bilayer adhesion promoter/diffusion barrier 91. The metal layer 92 is preferably cooper, which can be electroplated or electroless plated on the substrate assembly 80 at a process temperature around 30° C. A thick copper film (0.5 to 1.0 micron thick) preferably is deposited. The metal layer 46 may also be deposited using a chemical vapor deposition (CVD) process. As with the previous embodiment the bilayer adhesion promoter/diffusion barrier 91 may be omitted or optionally used, with a CVD metal layer process or if the metal is deposited by high-rate magnetron sputtering or if evaboration is used.

With reference to FIG. 12, the excess metal from the metal layer 92 and the excess bilayer adhesion promoter/diffusion barrier 91 are removed through mechanical abrasion, for example, by chemical mechanical polishing (CMP), to form metal plugs 93,94. The substrate assembly 80 is planar after the removal of the excess metal. The remaining portions of the bilayer adhesion promoter/diffusion barrier 91 define receptacles, in which the metal plugs 93,94 are located. The steps of applying a patterned photoresist layer, a bilayer adhesion promoter/diffusion barrier and another metal layer, as described with reference to FIGS. 5 to 8, can be repeated to build up more layers of metals as needed. When all metal layers are applied the photoresist layers are removed by ashing.

The multilevel metallized interconnect structure (FIG. 12) is coated with a low-k dielectric film 95 in one step. This one step may be a sol-gel method, a CVD process, a spin-on process, or a vapor deposition process. If needed, the low-k dielectric film 95 is planarized. This method allows the capacitance of long, high-speed lines, where it is most critical, to be significantly reduced through the use of a low-k dielectric.

The significant advantages of fabricating a multilevel interconnect structure with a coating of low-k dielectric in accordance with the present invention are that the time for depositing the dielectric is substantially reduced. The use of low-k dielectrics in contact with interconnection and clock lines reduce RC signal delays and power dissipation.

The present invention may be employed to fabricate an interconnect structure for use in any type of integrated circuit device including, but not limited to, microprocessors, logic devices, DSP and memory circuits, such as DRAMS, SRAMS, SDRAMS, etc.

It is to be understood that the figures have been simplified to illustrate only those aspects of semiconductor topography which are relevant, and some of the dimensions have been exaggerated to convey a clear understanding of the present invention, while eliminating, for the purposes of clarity, some elements normally found on or in a semiconductor structure. Those of ordinary skill in the art will recognize that other elements and process steps are required to produce an operational semiconductor. However, because such elements and process steps are well known in the art, and because they do not further aid in the understanding of the present invention, a discussion of such elements is not provided herein.

Although the present invention has been described with reference to preferred embodiments, it is to be understood that modifications and variations may be made without departing from the spirit and scope of this invention, as those skilled in the art will readily understand. All such modifications and variations are considered to be part of the invention. Accordingly, the invention is not limited by the foregoing description, but is only limited by the scope of the appended claims.

What is claimed is:

1. A method of fabricating a semiconductor interconnect structure comprising the steps of:
   depositing a layer of photoresist on a substrate assembly;
   etching the photoresist layer to form a plurality of openings;
   depositing a metal layer on the photoresist layer to fill the openings formed in the photoresist layer;
   removing the photoresist layer such that the metal layer is supported by the metal which fills the openings formed in the photoresist; and
   depositing a low-k dielectric film on the interconnect structure.

2. The method of claim 1 wherein the low-k dielectric film is deposited on said metal layer.

3. The method of claim 1 further comprising the step of depositing a bilayer adhesion promoter/diffusion barrier prior to the step of depositing said metal layer.

4. The method of claim 3 wherein said bilayer adhesion promoter/diffusion barrier is deposited by an ionized sputtering process.

5. The method of claim 3 wherein said bilayer adhesion promoter/diffusion barrier is deposited by a chemical vapor depositing process.

6. The method of claim 1 wherein said metal layer comprises a copper containing material deposited by an electroplating process.

7. The method of claim 1 wherein said metal layer comprises a copper containing material deposited by an electroless plating process.

8. The method of claim 1 wherein said metal layer comprises a copper containing material deposited by a chemical vapor depositing process.

9. The method of claim 1 wherein said resist layer is removed by ashing in a plasma.

10. The method of claim 1 wherein said bilayer adhesion promoter/diffusion barrier is selected from the group consisting of titanium/copper, chromium/copper, titanium nitride/copper, tantalum/copper, W/copper and WN/copper.

11. The method of claim 1 wherein said bilayer adhesion promoter/diffusion barrier is selected from the group consisting of W/copper and WN/copper.

12. The method of claim 1 wherein said dielectric film has a dielectric constant of from about 1 to about 2.5.

13. The method of claim 1 wherein said dielectric film has a dielectric constant of from about 1 to about 2.0.

14. The method of claim 1 wherein said dielectric film is selected from the group consisting of aerogels and xerogels.

15. The method of claim 1 wherein the metal layer comprises a copper containing material and has a thickness of from about 0.5 micron to about 1.0 micron.

16. A method of fabricating a multilevel semiconductor interconnect structure comprising the steps of:
   (i) depositing a layer of photoresist on a substrate assembly;
   (ii) etching the photoresist layer to form a plurality of openings;
   (iii) depositing a metal layer on the photoresist layer to fill the openings formed in the photoresist layer;
   (iv) repeating the steps of (i) depositing a layer of photoresist, (ii) etching the photoresist layer and (iii) depositing a metal layer until a predetermined number of metal layers levels are formed;
   (v) removing the photoresist layers such that the metal layers are supported by the metal which filled the openings formed in the photoresist; and
   (vi) depositing a low-k dielectric film on the interconnect structure.

17. The method of claim 16 wherein said resist layers are removed by ashing a plasma into said interconnect structure.

18. The method of claim 16 wherein said bilayer adhesion promoter/diffusion barriers are selected from the group consisting of titanium/copper, chromium/copper, titanium nitride/copper, tantalum/copper, W/copper and WN/copper.

19. The method of claim 16 wherein said bilayer adhesion promoter/diffusion barriers are selected from the group consisting of W/copper and WN/copper.

20. The method of claim 16 wherein said dielectric film has a dielectric constant of from about 1 to about 2.5.

21. The method of claim 16 wherein said dielectric films has a dielectric constant of from about 1 to about 2.0.

22. The method of claim 16 wherein said dielectric film is selected from the group consisting of aerogels and xerogels.

23. The method of claim 16 wherein the metal layers are copper and have a thickness of from about 0.5 micron to about 1.0 micron.

24. A method of claim 16 wherein said metal layers are formed of a copper containing material.

* * * * *